(12) United States Patent
Inoue et al.

(10) Patent No.: US 9,099,634 B2
(45) Date of Patent: Aug. 4, 2015

(54) ELASTIC-WAVE FILTER DEVICE AND COMPOSITE DEVICE INCLUDING THE SAME

(75) Inventors: Takashi Inoue, Osaka (JP); Hiroyuki Nakamura, Osaka (JP)

(73) Assignee: SKYWORKS PANASONIC FILTER SOLUTIONS JAPAN CO., LTD., Osaka (JP)

( * ) Notice: Subject to any disclaimer, the term of this patent is extended or adjusted under 35 U.S.C. 154(b) by 500 days.

(21) Appl. No.: 13/405,415

(22) Filed: Feb. 27, 2012

(65) Prior Publication Data
US 2012/0223789 A1  Sep. 6, 2012

(30) Foreign Application Priority Data

Mar. 1, 2011 (JP) .................................. 2011-043481

(51) Int. Cl.

| | |
|---|---|
| *H03H 9/72* | (2006.01) |
| *H03H 9/64* | (2006.01) |
| *H01L 41/053* | (2006.01) |
| *H03H 9/05* | (2006.01) |
| *H03H 9/10* | (2006.01) |
| *H03H 3/08* | (2006.01) |

(52) U.S. Cl.
CPC .............. *H01L 41/053* (2013.01); *H03H 3/08* (2013.01); *H03H 9/059* (2013.01); *H03H 9/0576* (2013.01); *H03H 9/1085* (2013.01); *H03H 9/1092* (2013.01); *H03H 9/64* (2013.01)

(58) Field of Classification Search
CPC ............ H03H 9/02574; H03H 9/0542; H03H 9/0576; H03H 9/058; H03H 9/059; H03H 9/1085; H03H 9/1092; H03H 9/725; H03H 2009/0019; H03H 3/08; H03H 9/64; H01L 41/053

USPC ................................... 333/133, 189, 193, 195
See application file for complete search history.

(56) References Cited

U.S. PATENT DOCUMENTS

| | | | | |
|---|---|---|---|---|
| 6,339,365 | B1 * | 1/2002 | Kawase et al. | 333/193 |
| 7,609,129 | B2 * | 10/2009 | Yokota et al. | 333/133 |
| 7,701,311 | B2 * | 4/2010 | Nakamura et al. | 333/133 |
| 8,040,205 | B2 * | 10/2011 | Hatano et al. | 333/133 |
| 2004/0135650 | A1 * | 7/2004 | Miura et al. | 333/133 |
| 2008/0018414 | A1 * | 1/2008 | Inoue et al. | 333/133 |
| 2009/0309673 | A1 | 12/2009 | Iwamoto | 333/133 |
| 2010/0207708 | A1 * | 8/2010 | Haruta | 333/195 |
| 2010/0289600 | A1 * | 11/2010 | Takada et al. | 333/193 |

FOREIGN PATENT DOCUMENTS

| | | | |
|---|---|---|---|
| JP | 2001-257236 | * | 9/2001 |
| WO | 2008/105199 | | 9/2008 |

* cited by examiner

*Primary Examiner* — Barbara Summons
(74) *Attorney, Agent, or Firm* — Lando & Anastasi, LLP

(57) ABSTRACT

An elastic-wave filter device includes a first piezoelectric substrate, a second piezoelectric substrate, a first pillar-like wiring electrode, and a second pillar-like wiring electrode. The first and second substrates have a first and a second IDT electrodes on their top faces respectively. A lateral face of the second substrate confronts a lateral face of the first substrate. The first pillar-like electrode and the second pillar-like electrode are formed above the first and the second substrates respectively, and are electrically connected to the first and the second IDT electrodes respectively. The first substrate is thicker than the second substrate. A distance between a plane including the top face of the first substrate and a plane including the top face of the second substrate is smaller than a distance between a plane including an underside of the first substrate and a plane including an underside of the second substrate.

20 Claims, 14 Drawing Sheets

ELASTIC-WAVE FILTER DEVICE AND COMPOSITE DEVICE INCLUDING THE SAME

FIELD OF INVENTION

The present invention relates to an elastic-wave filter device and a composite device including the same elastic-wave filter device.

BACKGROUND OF INVENTION

FIG. 16 is a sectional view that schematically illustrates a conventional elastic-wave filter device. As shown in FIG. 16, elastic-wave filter device 101 includes first piezoelectric substrate 103, second piezoelectric substrate 105, and sealing member 106. First piezoelectric substrate 103 has first IDT (interdigital transducer) electrode 102 on its top face. Second piezoelectric substrate 105 is disposed such that its lateral face confronts a lateral face of first piezoelectric substrate 103, and has second IDT electrode 104 on its top face. Sealing member 106 includes first sealer 106A and second sealer 106B. First sealer 106A is formed such that it covers at least an underside of first piezoelectric substrate 103 and an underside of second piezoelectric substrate 105. Second sealer 106B covers at least the lateral faces of first and second piezoelectric substrates 103 and 105. On top of that, elastic-wave filter device 101 includes first pillar-like wiring electrode 107, first externally connecting terminal 108, second pillar-like wiring electrode 109, and second externally connecting terminal 110. First pillar-like wiring electrode 107 is formed above first piezoelectric substrate 103 and electrically connected to first IDT electrode 102. Second pillar-like wiring electrode 109 is formed above second piezoelectric substrate 105 and electrically connected to second IDT electrode 104. Second externally connecting terminal 110 is electrically connected to second pillar-like wiring electrode 109.

In the structure discussed above, sealing member 106 integrates first piezoelectric substrate 103 and second piezoelectric substrate 105 into one body.

The foregoing elastic-wave filter device 101 is structured such that the underside of first piezoelectric substrate 103 is flush with the underside of second piezoelectric substrate 105. In a case where first piezoelectric substrate 103 is thicker than second piezoelectric substrate 105. The foregoing structure produces a greater distance between a plane including the top face of substrate 103 and a plane including the top face of substrate 105. In other words, this structure produces a greater step "d" between the top face of first piezoelectric substrate 103 and the top face of second piezoelectric substrate 105. Assume that filter device 101 is mounted to a mother board (not shown), then first externally connecting terminal 108 and second externally connecting terminal 110 are desirably formed on planes flush with each other. To achieve the planes flush with each other, first pillar-like wiring electrode 107 needs to be different from second pillar-like wiring electrode 109 in height by the step "d". Forming this difference complicates a manufacturing process of filter device 101.

SUMMARY OF INVENTION

An elastic-wave filter device of the present invention includes a first piezoelectric substrate, a second piezoelectric substrate, a sealing member, a first pillar-like wiring electrode, a second pillar-like wiring electrode, a first externally connecting terminal, and a second externally connecting terminal. A first IDT (interdigital transducer) electrode is formed on a top face of the first piezoelectric substrate. A second IDT electrode is formed on a top face of the second piezoelectric substrate, and its lateral face confronts a lateral face of the first piezoelectric substrate. The sealing member covers at least each underside of first and second piezoelectric substrates. The first pillar-like wiring electrode is formed above the first piezoelectric substrate 103 and electrically connected to the first IDT electrode. The first externally connecting terminal is electrically connected to the first pillar-like wiring terminal. The second pillar-like wiring electrode is formed above the second piezoelectric substrate and electrically connected to the second IDT electrode. The second externally connecting electrode is electrically connected to the second pillar-like wiring electrode. The first piezoelectric substrate is thicker than the second piezoelectric substrate. A distance between a plane including the top face of the first piezoelectric substrate and a plane including the top face of the second piezoelectric substrate is smaller than a distance between a plane including the underside of the first piezoelectric substrate and a plane including the underside of the second piezoelectric substrate.

DETAILED DESCRIPTION OF PREFERRED EMBODIMENT

Figure 1:
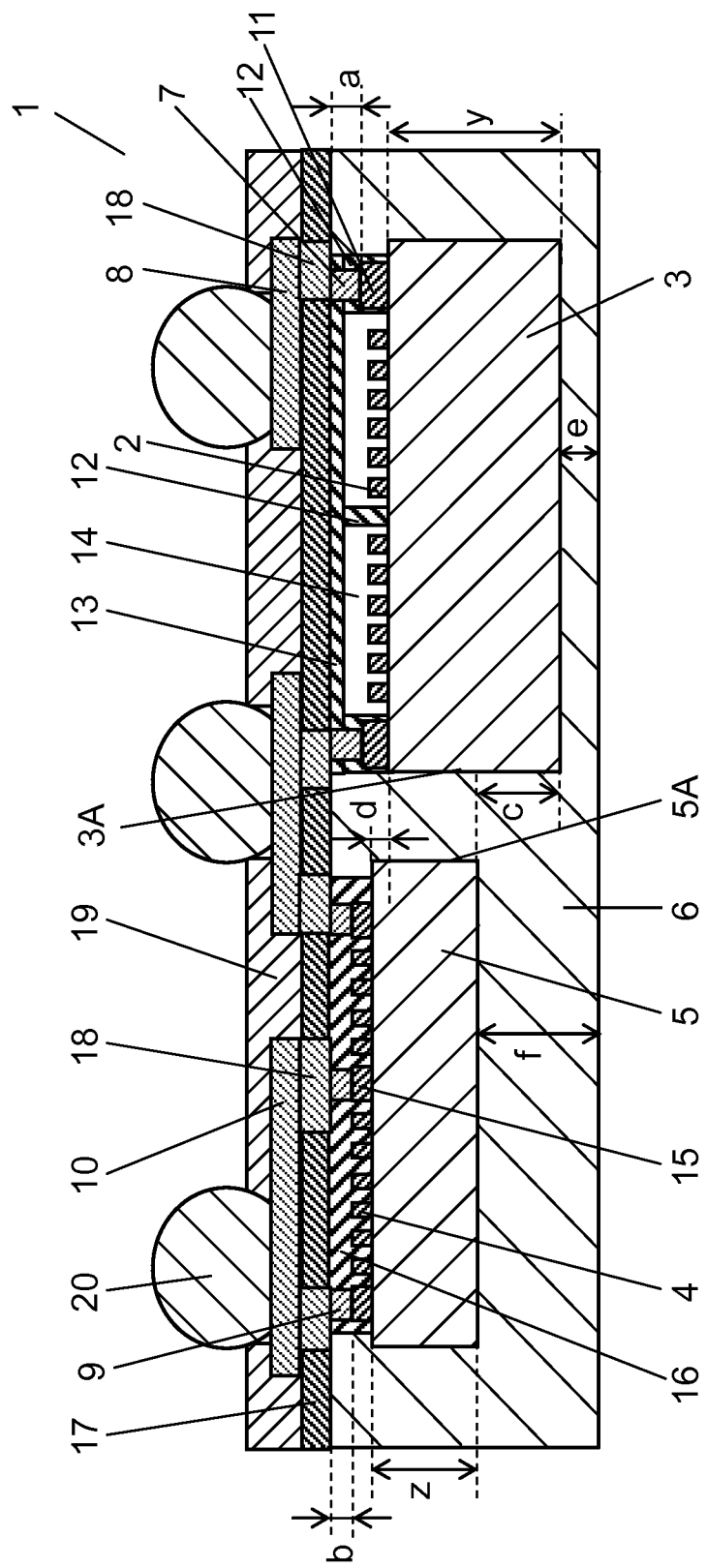
FIG. 1 is a sectional view schematically illustrating an elastic-wave filter device in accordance with an embodiment of the present invention.

FIG. 1 is a sectional view schematically illustrating elastic-wave filter device 1 in accordance with the embodiment of the present invention. Filter device 1 as a composite device includes a first functional substrate and a second functional substrate, and those substrates are disposed such that their lateral faces confront each other in parallel with a predetermined space therebetween.

Elastic-wave filter device 1 is described hereinafter on the assumption that the first functional substrate is referred to as first piezoelectric substrate 3 working as an elastic surface-wave substrate and the second functional substrate is referred to as second piezoelectric substrate 5 working as an elastic boundary-wave substrate.

Elastic-wave filter device 1 works as, e.g. an antenna duplexer for Band 1 of CDMA (code division multiple access) standard. Use of first piezoelectric substrate 3 allows forming a first filter that is a transmission filter for passing a signal in a first frequency band of 2021 MHz-2080 MHz. Use of second piezoelectric substrate 5 allows forming a second filter that is a reception filter for passing a signal in a second frequency band of 2210 MHz-2270 MHz. First piezoelectric substrate 3 and second piezoelectric substrate 5 can be made of different materials from each other or identical material with each other.

Elastic-wave filter device 1 includes first piezoelectric substrate 3, second piezoelectric substrate 5, and sealing member 6. First IDT electrode 2 working as a first functional circuit is formed on a top face of first piezoelectric substrate 3. Second piezoelectric substrate 5 is disposed such that one of lateral faces 5A thereof confronts one of lateral faces 3A of first piezoelectric substrate 3. Second IDT electrode 4 working as a second functional circuit is formed on a top face of second piezoelectric substrate 5. Sealing member 6 covers at least an underside of first substrate 3 and an underside of second substrate 5. Elastic-wave filter device 1 further includes first pillar-like wiring electrode 7, first externally connecting terminal 8, second pillar-like wiring electrode 9, and second externally connecting terminal 10. First pillar-like wiring electrode 7 is formed above first piezoelectric substrate 3 and electrically connected to first IDT electrode 2. First externally connecting terminal 8 is electrically connected to first pillar-like wiring electrode 7. Second pillar-like wiring electrode 9 is formed above second piezoelectric substrate 5 and electrically connected to second IDT electrode 4. Second externally connecting terminal 10 is electrically connected to second pillar-like wiring electrode 9.

The foregoing structure allows sealing member 6 to integrate first piezoelectric substrate 3 and second piezoelectric substrate 5 together into one body, so that elastic-wave filter device 1 can be downsized.

Within elastic-wave filter device 1, first piezoelectric substrate 3 has a thickness "y" greater than a thickness "z" of second piezoelectric substrate 5. To be more specific, a greater thickness of first piezoelectric substrate 3 forming the first filter, of which frequency pass band is relatively low, than a thickness of second piezoelectric substrate 5 allows improving filter characteristics of each filter.

In the foregoing structure, distance "d" between a plane including the top face of first piezoelectric substrate 3 and a plane including the top face of second piezoelectric substrate 5 is smaller than distance "c" between a plane including an underside of first piezoelectric substrate 3 and a plane including an underside of second piezoelectric substrate 5. This structure allows a difference between height "a" of first pillar-like wiring electrode 7 and height "b" of second pillar-like wiring electrode 9 to be smaller than the foregoing distance "c" between the plane including the underside of first piezoelectric substrate 3 and the plane including the underside of second piezoelectric substrate 5. Although the thickness of first piezoelectric substrate 3 differs from that of second piezoelectric substrate 5, the structure discussed above allows simplifying the manufacturing process of elastic-wave filter device 1, in particular, the process of first pillar-like wiring electrode 7 and second pillar-like wiring electrode 9.

A difference between a plane on which first externally connecting terminal 8 is formed and a plane on which second externally connecting terminal 10 is formed is preferably smaller than difference "c", i.e. the difference in thickness between the first and the second piezoelectric substrates 3 and 5. In other words, a difference between the plane including the top face of first pillar-like wiring electrode 7 and the plane including the top face of second pillar-like wiring electrode 9 is preferably smaller than difference "c". As shown in FIG. 1, the plane on which first externally connecting terminal 8 is formed is preferably flush with the plane on which second externally connecting terminal 10 is formed.

Within elastic-wave filter device 1, a distance between a plane including an underside of sealing member 6 under first piezoelectric substrate 3 and a plane including an underside of sealing member 6 under second piezoelectric substrate 5 is preferably smaller than the distance "c" between the plane including the underside of first piezoelectric substrate 3 and the plane including the underside of second piezoelectric substrate 5. This structure allows handling elastic-wave filter device 1 from its underside with ease. It is more preferable, as shown in FIG. 1, that the plane including the underside of sealing member 6 under first piezoelectric substrate 3 be flush with the plane including the underside of sealing member 6 under second piezoelectric substrate 5.

Distance "e" between the underside of sealing member 6 under first piezoelectric substrate 3 and the underside of first piezoelectric substrate 3 is preferably smaller than distance "f" between the underside of sealing member 6 under second piezoelectric substrate 5 and the underside of second piezoelectric substrate 5. This structure allows handling elastic-wave filter device 1 with ease from the underside of device 1.

Each one of the structural elements of elastic-wave filter device 1 in accordance with the embodiment is detailed hereinafter. First piezoelectric substrate 3 forms, e.g. an elastic surface wave element. Above first substrate 3, there are first IDT (interdigital transducer) electrode 2 formed on first substrate 3, inner electrode 11 electrically connected to first IDT electrode 2, lateral wall 12 surrounding first IDT electrode 2, and lid 13 formed on lateral wall 12 such that space 14 can be provided above first IDT electrode 2.

First piezoelectric substrate 3 is made of single crystal piezoelectric body of which thickness ranges from 210 to 350 µm. The single crystal piezoelectric body is formed of, e.g. crystal-, lithium tantalate-, lithium niobate-, or potassium niobate-, based substrate.

First IDT electrode 2 forms a comb-shaped electrode of which thickness ranges from 0.1 to 0.5 µm, and is made of single metal, e.g. Al, Cu, Ag, Au, Ti, W, Pt, Cr, or Mo, or an alloy chiefly made of these metals, or a lamination of these metals.

Inner electrode 11 is an electrical conductor for connecting first IDT electrode 2 to first externally connecting terminal 8, and is made of single metal, e.g. Al, Cu, or Ag, or an alloy chiefly made of these metals, or a lamination of these metals.

Lateral wall 12 is an insulator, of which height ranges approximately from 5 to 15 µm, and surrounds at least a part of first IDT electrode 2. Lateral wall 12 is made of resin or the like that can be shaped into a given shape with ease. Use of photosensitive resin, in particular, allows forming lateral wall 12 with accuracy into a given shape adequate for fabricating multiple elastic-wave filter devices on a piezoelectric substrate. The photosensitive resin can be any resin material as far as it has photosensitivity, such as photosensitive polyimide resin, photosensitive epoxy resin, or photosensitive acrylate resin. Among these materials, the photosensitive polyimide resin is a preferable material for lateral wall 12 because its glass transition temperature is high and it is reliable in a high temperature environment.

Lid 13 is a top plate of which thickness ranges approximately from 1-10 µm and is bonded to an upper section of lateral wall 12 with an adhesive layer (not shown). First IDT electrode 2 is accommodated in a space that is formed of lid 13, first piezoelectric substrate 3, and lateral wall 12. Lid 13 is preferably made of metal so that its strength can be increased, and the electric conductivity of the metal allows controlling an electric potential of lid 13. It is more preferable to use copper as this metal because a linear expansion coefficient of lid 13 can be almost equal to that of first piezoelectric substrate 3 made of single crystal piezoelectric body. A sheet made of photosensitive resin can be used as lid 13. The adhesive layer (not shown) is formed of adhesive having a thickness ranging approximately from 1-10 µm, and made of, e.g. epoxy-, polyphenylene-, or butadiene-, based resin, or resin mixed of these materials.

Space 14 is formed by being surrounded by first piezoelectric substrate 3, lateral wall 12, and lid 13. Space 14 has air-tightness and accommodates first IDT electrode 2 therein. Space 14 can include air of a normal atmospheric pressure but space 14 is preferably depressurized therein and sealed because this environment can prevent first IDT electrode 2 from corrosion.

First pillar-like wiring electrode 7 is formed by an electrolytic plating method on inner electrode 11 via a sputtered film (not shown). It can be made of single metal, e.g. Cu, Au, Ag, Pt, or Ni, or an alloy chiefly made of these metals, or a lamination of these metals. Use of Cu among others is preferable because it is excellent in mechanical strength and allows a linear expansion coefficient of electrode 7 to be matched with that of first piezoelectric substrate 3. First pillar-like wiring electrode 7 can be formed extending through lateral wall 12 and lid 13, or it can be formed not extending through them. In a case where electrode 7 is formed not extending through them, it is formed outside lateral wall 12 and lid 13, i.e. opposite side to space 14. The sputtered film is a metal thin film formed on inner electrode 11 and on an outer face of lateral wall 12. The sputtered film is made of a single metal, e.g. Ti, Cu, Ni, Cr, or Mg, or an alloy chiefly made of these metals. These materials have a lower solubility in plating solution than inner electrode 11. Use of Ti among others is preferable because it has high adherence. It is more preferable to form Cu on top of Ti, i.e. the sputtered film has a double-layer, because this structure allows forming first pillar-like wiring electrode 7 with ease.

Second piezoelectric substrate 5 forms, e.g. an elastic surface boundary wave element, and second IDT electrode 4 is formed on substrate 5. Inner electrode 15 connected to second IDT electrode 4 and inorganic insulating film 16 covering second IDT electrode 4 are also provided on substrate 5.

Second piezoelectric substrate 5 is formed of single crystal piezoelectric body of 50-300 µm thickness, and substrate 5 is, e.g. crystal-, lithium tantalate-, lithium niobate-, or potassium niobate-, based substrate.

Second IDT electrode 4 is a comb-shaped electrode of 0.1-0.5 µm thickness and is made of single metal, e.g. Al, Cu, Ag, Au, Ti, W, Pt, Cr, or Mo, or an alloy chiefly made of these metals, or a lamination of these metals.

Inner electrode 15 is an electrical conductor for connecting second IDT electrode 4 to second externally connecting terminal 10, and is made of, e.g. single metal, e.g. Al, Cu, or Ag, or an alloy chiefly made of these metals, or a lamination of these metals.

Inorganic insulating film 16 is made of $SiO_2$ of 1-10 µm thickness; however, it can be made of any medium as long as it has frequency-temperature characteristics reverse to that of second piezoelectric substrate 5. The thickness of film 16 refers to a distance between the top face of substrate 5 and a top face of film 16. Inorganic insulating film 16 can be formed by layering $SiO_2$ and another inorganic insulating material, e.g. SiN, in this order from substrate 5. This structure can improve the frequency-temperature characteristics of the second filter. $SiO_2$ is a medium through which a transverse wave travels at a slower speed than a transverse wave traveling through second piezoelectric substrate 5.

Second pillar-like wiring electrode 9 is formed by an electrolytic plating method on inner electrode 15 via a sputtered film (not shown). It can be made of single metal, e.g. Cu, Au, Ag, Pt, or Ni, or an alloy chiefly made of these metals, or a lamination of these metals. Use of Cu among others is preferable because it is excellent in mechanical strength and allows a linear expansion coefficient of electrode 9 to be matched with that of second piezoelectric substrate 5. Second pillar-like wiring electrode 9 can be formed extending through inorganic insulating film 16, or it can be formed not extending through film 16. In a case where electrode 9 is formed not extending through film 16, it is formed outside film 16.

Sealing member 6 mainly covers the underside and the lateral faces of first piezoelectric substrate 3, outer lateral faces of lateral wall 12 (opposite to space 14), the underside and lateral faces of second piezoelectric substrate 5, lateral faces (and a top face) of inorganic insulating film 16. Sealing member 6 covers the entire undersides of first and second piezoelectric substrates 3, 5 for protecting first and second IDT electrodes 2, 4 against mechanical shocks. Sealing member 6 is preferably made of thermosetting resin because of its excellence in handling, and use of epoxy resin among others is more preferable because of its advantage of heat resistance and air-tightness. Epoxy resin containing filler is still more preferable because the linear expansion coefficient and heat conductivity can be adjusted. The filler can employ aluminum oxide, silicon dioxide, boron nitride, aluminum nitride, or magnesium oxide; however, the filler is not necessarily made of these materials, and it can be made of a variety of inorganic materials or metal materials, e.g. nickel.

Dielectric layer 17 is disposed between sealing member 6 and first externally connecting terminal 8. It is disposed also between sealing member 6 and second externally connecting terminal 10. Dielectric layer 17 is placed on sealing member 6; however, it can be placed directly on inorganic insulating film 16 or lid 13. Dielectric layer 17 is made of various kinds of resin, e.g. polyimide resin, epoxy resin, or acrylate resin. Among these materials, polyimide resin is preferable because its glass transition temperature is high and it is reliable in a high temperature environment. The material for dielectric layer 17 preferably has photosensitivity, so that dielectric layer 17 can be formed separately in some areas with ease. Dielectric layer 17 can also contain the filler, thereby adjusting the linear expansion coefficient. The filler can employ aluminum oxide, silicon dioxide, boron nitride, aluminum nitride, or magnesium oxide; however, the filler is not necessarily made of these materials, and it can be made of a variety of inorganic materials or metal materials, e.g. nickel.

First pillar-like wiring electrode 7 is electrically connected to first externally connecting terminal 8 via connecting electrode 18 that extends through dielectric layer 17. Second pillar-like wiring electrode 9 is electrically connected to second externally connecting terminal 10 via another connecting electrode 18 that is formed via a sputtered film (not shown) on first and second pillar-like wiring electrodes 7, 9 by an electrolytic plating process. Connecting electrode 18 can be made of single metal, e.g. Cu, Au, Ag, Pt, or Ni, or an alloy chiefly made of these metals, or a lamination of these metals. Use of Cu among others is preferable because it is excellent in mechanical strength and allows matching a linear expansion coefficient of electrode 18 with that of second piezoelectric substrate 5.

First and second externally connecting electrodes 8 and 10 can be made of single metal, e.g. Cu, Au, Ag, Pt, Ni, or Sn or an alloy chiefly made of these metals, or a lamination of these metals. Use of Cu among others is preferable because it is excellent in mechanical strength and allows matching a linear expansion coefficient of electrodes 8 and 10 with that of second piezoelectric substrate 5.

Upper-layer protective film 19 is formed on dielectric layer 17 and externally connecting terminals 8, 10; however, it is not formed on the places (not shown) where terminals 8 and 10 are mounted onto the substrate, and these places remain exposed. Upper-layer protective film 19 can be made of various kinds of resin, e.g. polyimide resin, epoxy resin, or acrylate resin. Among these materials, polyimide resin is preferable because its glass transition temperature is high and it is reliable in a high temperature environment. The material for film 19 preferably has photosensitivity, so that film 19 can be formed in some areas separately with ease. Upper-layer protective film 19 can also contain the filler, thereby adjusting the linear expansion coefficient. The filler can employ aluminum oxide, silicon dioxide, boron nitride, aluminum nitride, or magnesium oxide; however, the filler is not necessarily made of these materials, and it can be made of a variety of inorganic materials or metal materials, e.g. nickel.

Elastic-wave filter device 1 can include externally connecting bump 20 on first and second externally connecting terminals 8 and 10.

Figure 2:
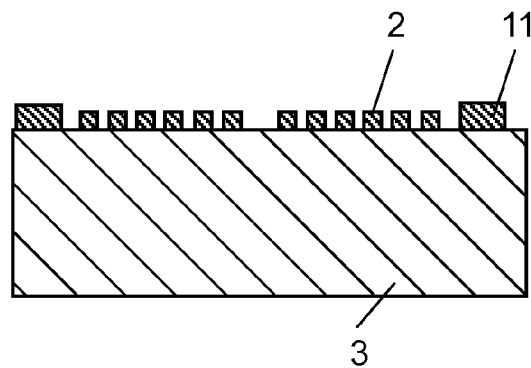
FIG. 2-FIG. 14 illustrate a manufacturing process of an elastic-wave filter device in accordance with an embodiment of the present invention.

A method of manufacturing elastic-wave filter device 1 discussed above and in accordance with the embodiment is demonstrated hereinafter. First, as shown in FIG. 2, first IDT electrode 2 is formed on the surface of first piezoelectric substrate 3 by a sputtering method with the aid of photolithographic technique using resist. Inner electrode 11 is formed on the surface of first piezoelectric substrate 3 by a deposition method. The first filter working as transmission filter 23 is thus formed.

Figure 3:
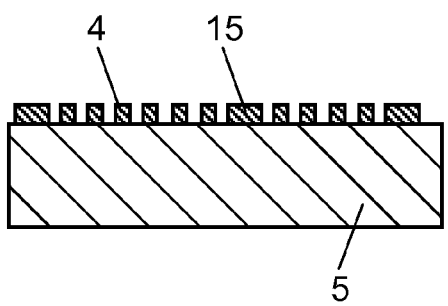

As shown in FIG. 3, second IDT electrode 4 is formed on the surface of second piezoelectric substrate 5 made of lithium niobate by the sputtering method with the aid of photolithograph technique using the resist. Inner electrode 15 is formed on the surface of second piezoelectric substrate 5 by a deposition method. The second filter working as reception filter 24 is thus formed.

Figure 4:
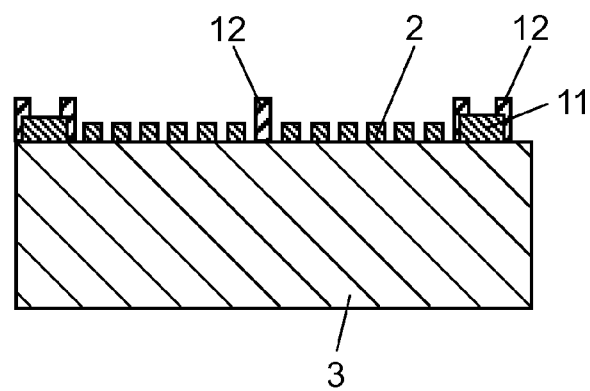

Next, as shown in FIG. 4, lateral wall 12 is formed on the top face of first piezoelectric substrate 3. In this embodiment, lateral wall 12 is made of photosensitive polyimide resin, and is formed by a patterning method with the aid of photolithographic technique. To be more specific, apply the composition of photosensitive polyimide resin onto the top face of substrate 3, and then the composition on the top face undergoes light exposure, development, and curing, whereby the patterning is completed. Lateral wall 12 is formed on the top face of first piezoelectric substrate 3 such that a section where first IDT electrode 2 is formed, i.e. elastic surface wave exciting section, and at least a part of inner electrode 11 can be exposed. The exposure of a part of inner electrode 11 allows first pillar-like wiring electrode 7 to be formed on the top face of inner electrode 11.

Figure 5:
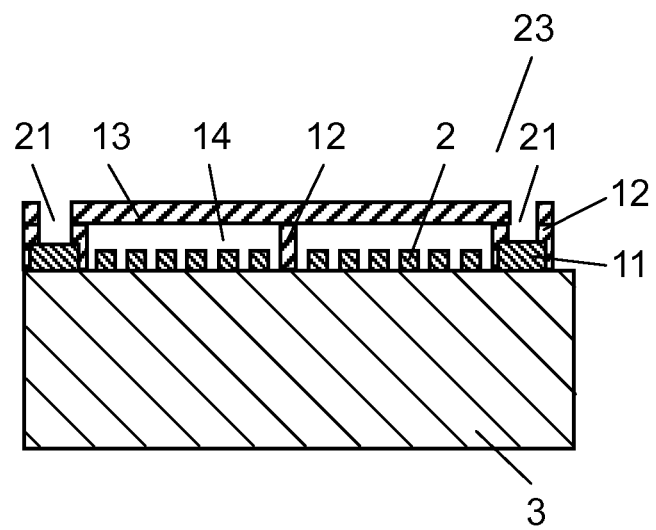

Next, as shown in FIG. 5, a metal foil to be lid 13 is stuck onto the top face of lateral wall 12 via adhesive (not shown). The metal foil is etched into a given pattern by the photolithographic technique, and the resist is removed. Lid 13 is thus formed. Lid 13 has opening 21 such that at least a part of inner electrode 11 can be exposed.

Figure 6:
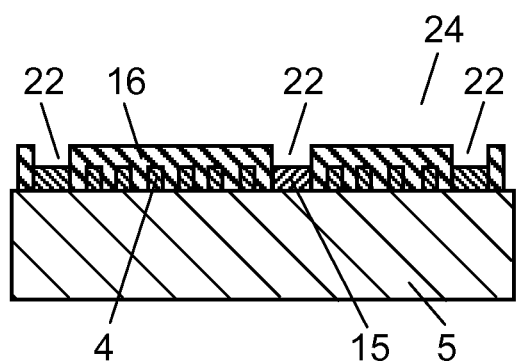

As shown in FIG. 6, inorganic insulating film 16 is formed on the top face of second piezoelectric substrate 5 by the sputtering method or the deposition method. After the formation of film 16, opening 22 is formed through film 16 at above inner electrode 15 by a dry etching method. Opening 22 is used later for forming second pillar-like wiring electrode 9 on the top face of inner electrode 15.

Transmission filter 23 shown in FIG. 5 and reception filter 24 shown in FIG. 6 are thus prepared. FIG. 2-FIG. 6 show steps of manufacturing filter 23 and filter 24 individually; however, a number of filters 23 or filters 24 can be formed at one time by implementing the steps discussed above on a large-area piezoelectric wafer to be first piezoelectric substrate 3 or second piezoelectric substrate 5, and then the wafer is diced.

Figure 7:
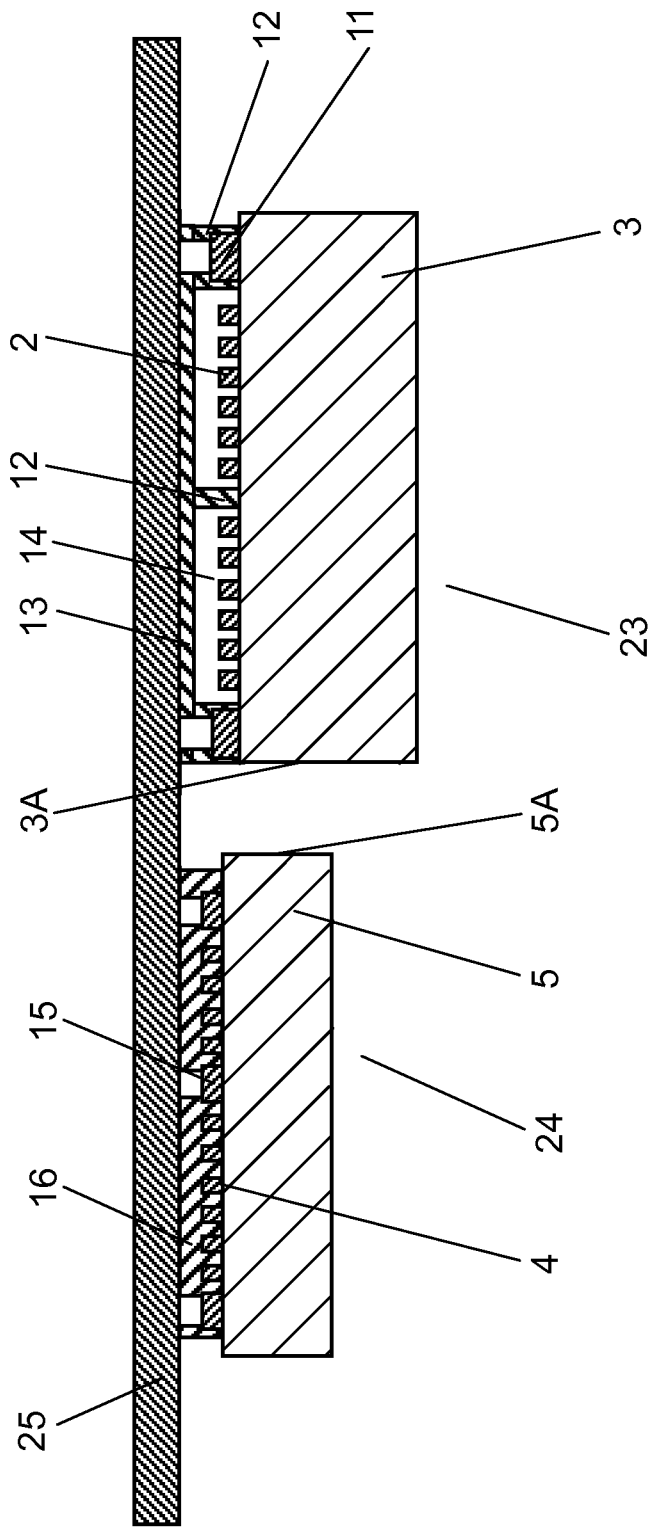

Next as shown in FIG. 7, pair the transmission filter 23 with the reception filter 24, and bond the top face of filter 23, namely, the top face of lid 13, and the top face of filter 24, namely, the top face of inorganic insulating film 16, onto carrier film 25. Although FIG. 7 shows a pair of transmission filter 23 and reception filter 24, multiple pairs of filter 23 and filter 24 can be tentatively bonded in a matrix shape to carrier film 25. To be more specific, form a tentative adhesive layer on carrier film 25, and then place filter 23 and filter 24 on the tentative adhesive layer for bonding them together temporarily. Carrier film 25 is made of a substrate of which surface includes a resin layer formed of an appropriate resin, e.g. poly-olefin epoxy resin, or a substrate of ceramic based on aluminum oxide. The tentative adhesive is not limited to some material, but alcohol soluble wax is used in this embodiment.

Figure 8:
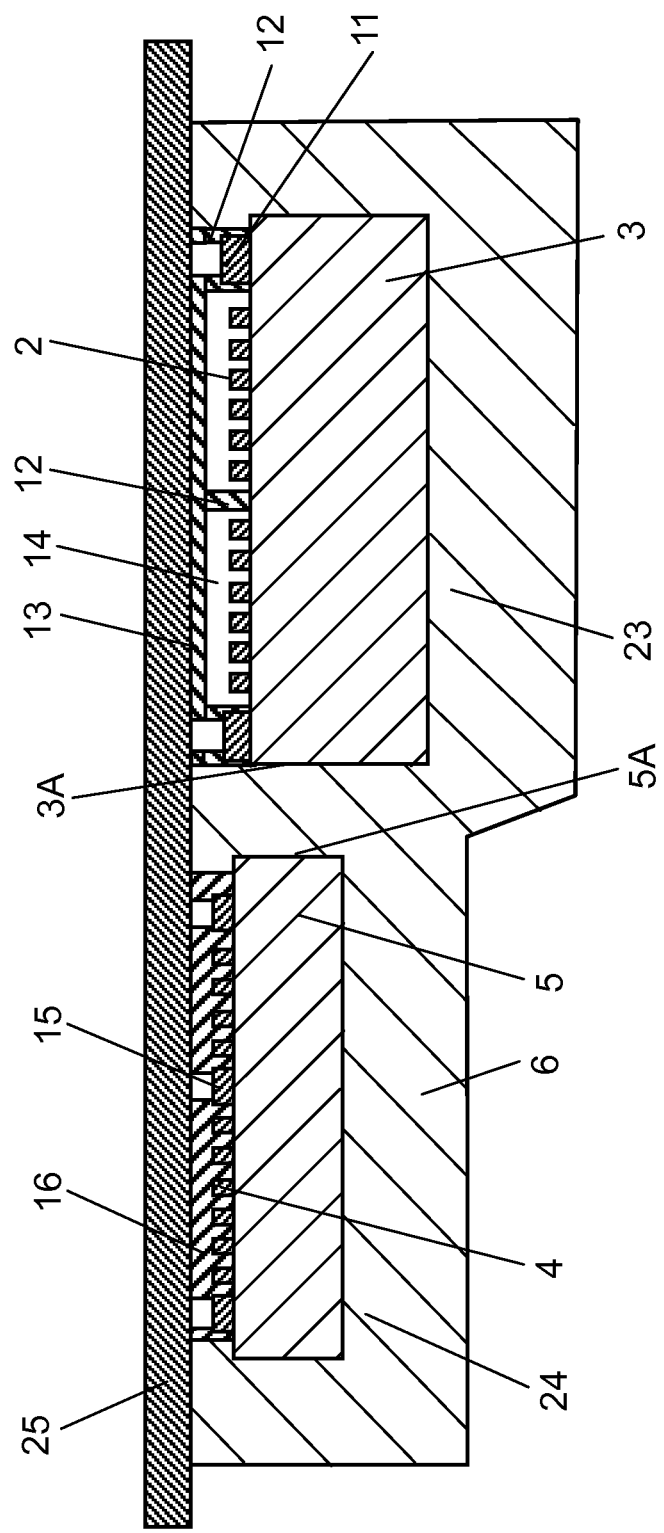

Next as shown in FIG. 8, form sealing member 6 for covering at least the undersides of transmission filter 23 and reception filter 24, i.e. the undersides of first piezoelectric substrate 3 and second piezoelectric substrate 5. In this embodiment, sealing member 6 is formed by printing the composition of epoxy resin. In other words, sealing member 6 is formed covering the undersides of a pair of filters formed of filter 23 and filter 24. In this embodiment, sealing member 6 covers not only the undersides of filters 23 and 24, but also covers respective lateral faces of filters 23 and 24.

Sealing member 6 can be provided such that it covers at least the undersides of filter 23 and filter 24, i.e. the undersides of substrates 3 and 5. However, sealing member 6 preferably covers not only the foregoing undersides but also the entire lateral faces as demonstrated in this embodiment, so that elastic-wave filter device 1 can improve the humidity resistance and the strength against mechanical shocks.

Figure 9:
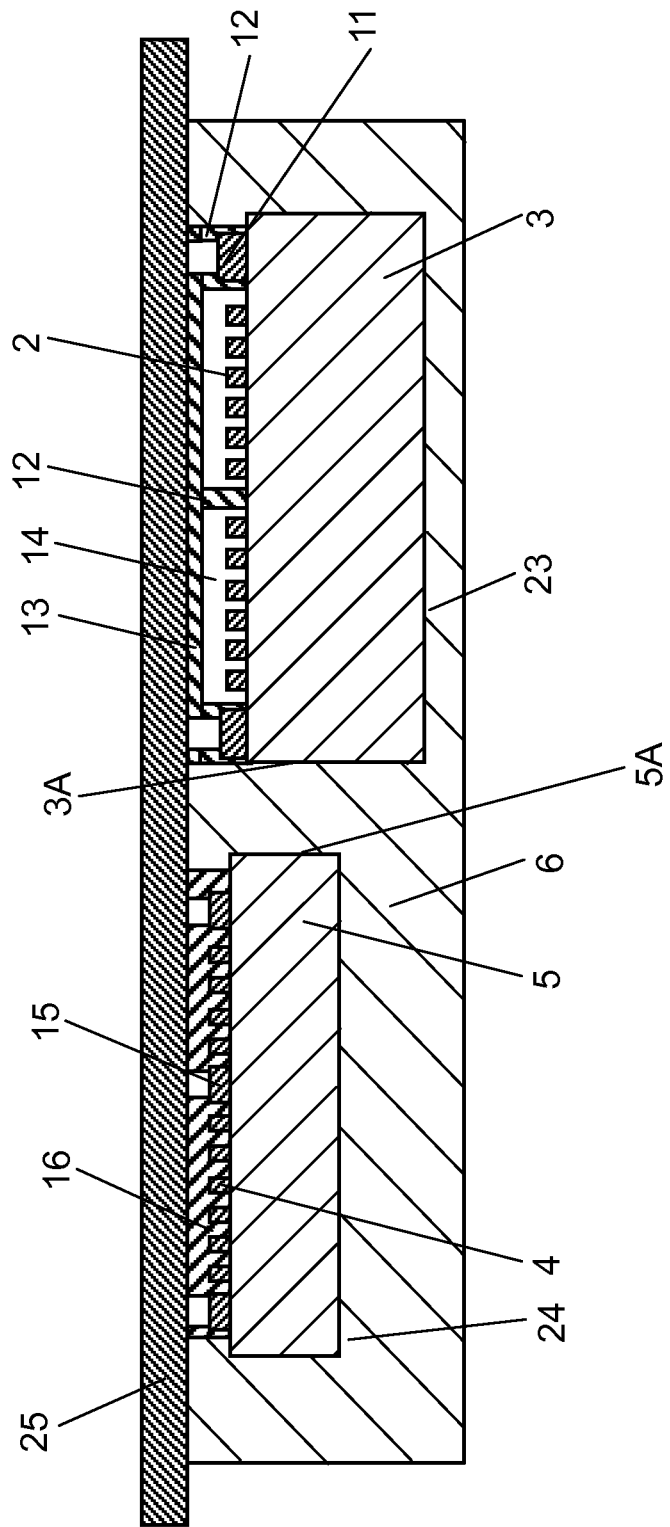

On top of that, as shown in FIG. 9, sealing member 6 is preferably polished from the lower side of elastic-wave filter device 1. The polishing allows a distance between a plane including the underside of sealing member 6 located under first piezoelectric substrate 3 and a plane including the underside of sealing member 6 located under second piezoelectric substrate 5 to be smaller than distance "c" between the plane including the underside of substrate 3 and the plane including the underside of substrate 5. It is more preferable, as shown in FIG. 9, that the plane including the underside of sealing member 6 located under first piezoelectric substrate 3 is flush with the plane including the underside of sealing member 6 located under second piezoelectric substrate 5. This structure allows elastic-wave filter device 1 to be handled with ease from the underside of device 1, and also to be of lower-profile.

Figure 10:
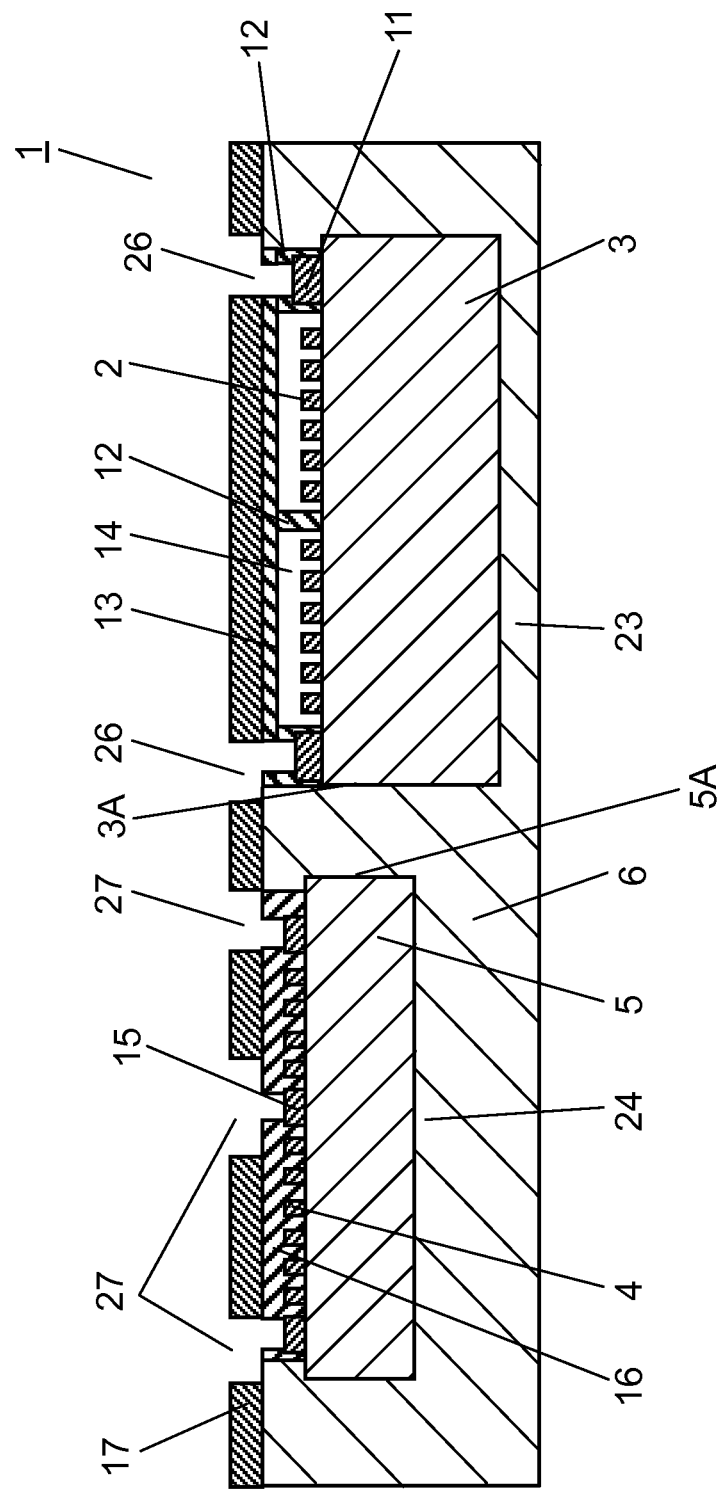

Next as shown in FIG. 10, peel off carrier film 25, and form dielectric layer 17 to cover the top faces of transmission filter 23 and reception filter 24. At this time, provide dielectric layer 17 with opening 26 at a section above inner electrode 11 of transmission filter 23, and provide dielectric layer 17 with opening 27 at a section above inner electrode 15 of reception filter 24. Dielectric layer 17 is formed by applying the composition of photosensitive epoxy resin onto the top faces of filters 23 and 24 by a spin-coating method, and then expose the photosensitive resin to light before it undergoes development and curing. Openings 26 and 27 are formed such that they can overlap with opening 21 of lid 13 and opening 22 of inorganic insulating film 16 respectively. This structure allows exposing at least a part of the top face of inner electrode 11 below opening 26, and exposing at least a part of the top face of inner electrode 15 below opening 27.

Next, form a copper (Cu) film and a titanium (Ti) film by a sputtering method on the entire top face of dielectric layer 17. A thickness of the copper film ranges approximately from 0.1 to 0.5 μm, and a thickness of the titanium film ranges approximately from 0.01-0.1 μm.

Figure 11:
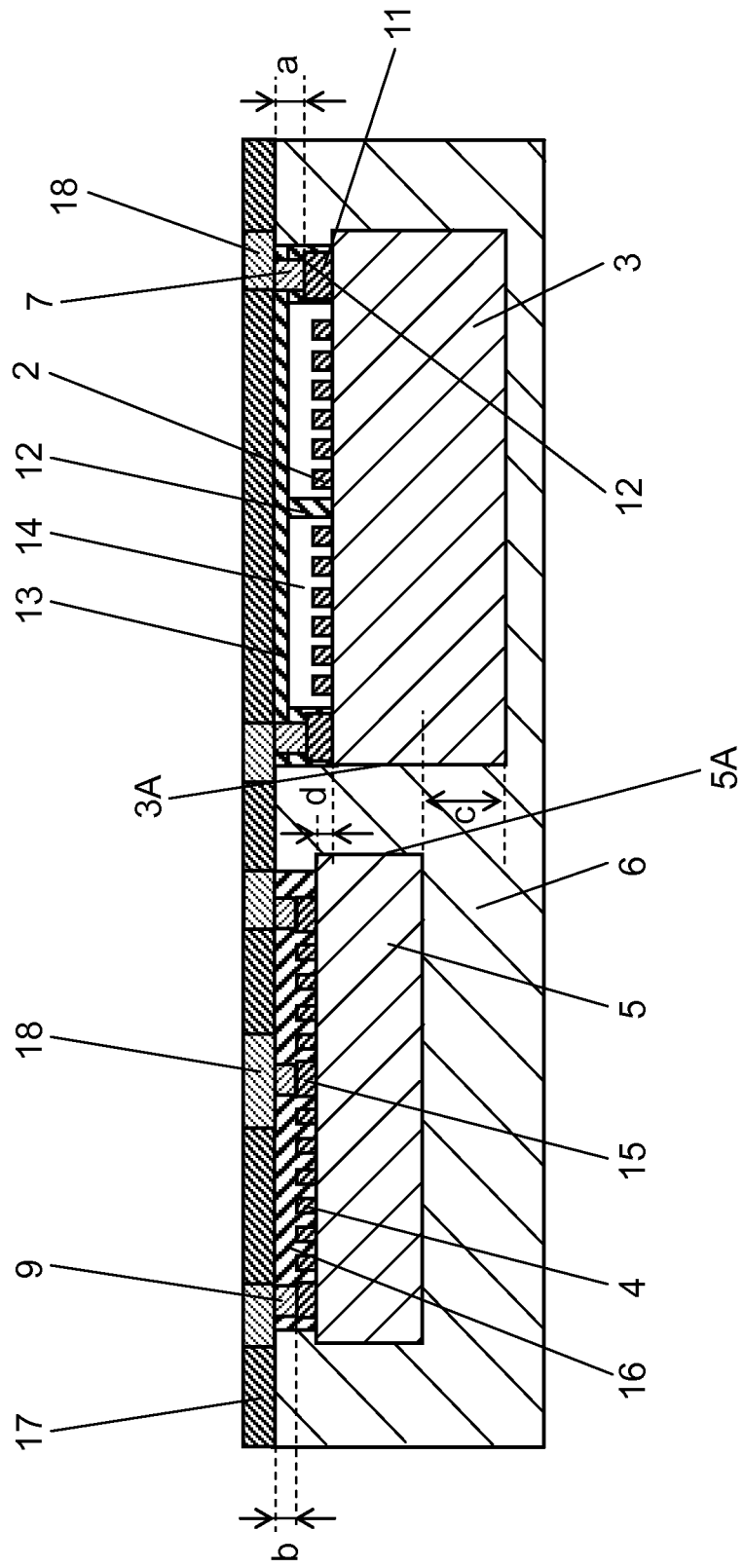

Next, as shown in FIG. 11, an electrolytic plating process is implemented using the copper film and the titanium film as a power-feeding film, whereby first pillar-like wiring electrode 7 is formed in opening 21 (in a through-hole of lateral wall 12 and lid 13) as well as connecting electrode 18 is formed in opening 26 (in a through-hole of dielectric layer 17). In a similar way, second pillar-like wiring electrode 9 is formed in opening 22 (in a through-hole of inorganic insulating film 16) as well as connecting electrode 18 is formed in opening 27 (in the through-hole of dielectric layer 17). The electrolytic plating employs metal material, e.g. copper.

During the manufacturing process in accordance with this embodiment, a step between the top face of transmission filter 23, i.e. the first filter, (namely the top face of lid 13) and the top face of reception filter 24, i.e. the second filter, (namely the top face of inorganic insulating film 16) is compared with step "c" between the underside of first piezoelectric substrate 3 and the underside of second piezoelectric substrate 5, so that the step is reduced in height. This preparation allows a difference between a height of first pillar-like wiring electrode 7 and that of second pillar-like wiring electrode 9 to be almost equal to difference "d" between the top face of substrate 3 and that of substrate 5. During the electrolytic plating process, this structure allows preventing a protruding of a plated metal from openings 21 and 26 located above first piezoelectric substrate 3 that is thicker than second piezoelectric substrate 5. As a result, a step of grinding the plated metal projecting can be eliminated, and on top of that, the height of second pillar-like wiring electrode 9 provided to second piezoelectric substrate 5 of lower profile can be regulated, so that the electrolytic plating process can be carried out within a shorter time. In FIG. 10 and FIG. 11, the copper film and the titanium film formed prior to the formation of the plated metal are omitted.

Figure 12:
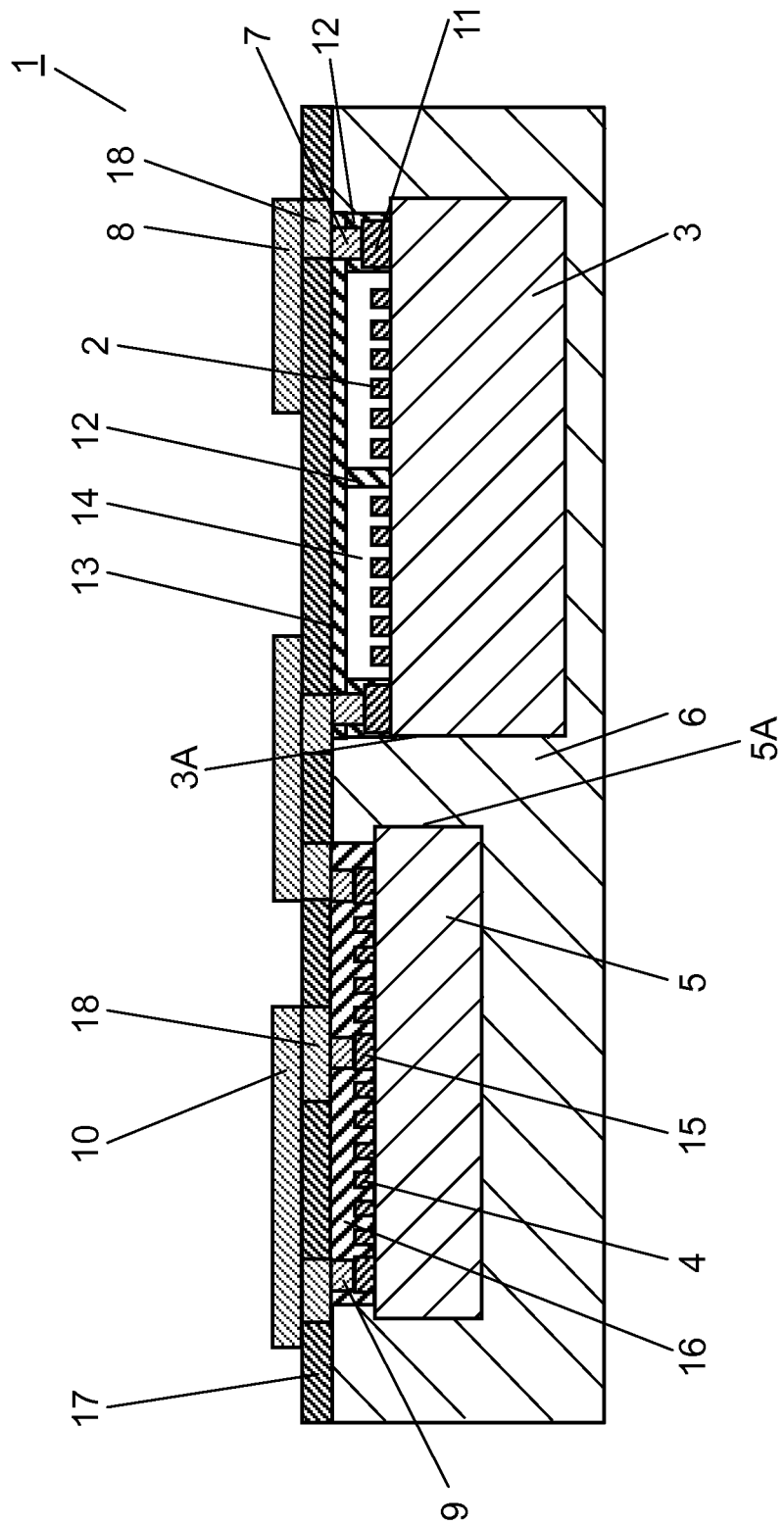
Figure 13:
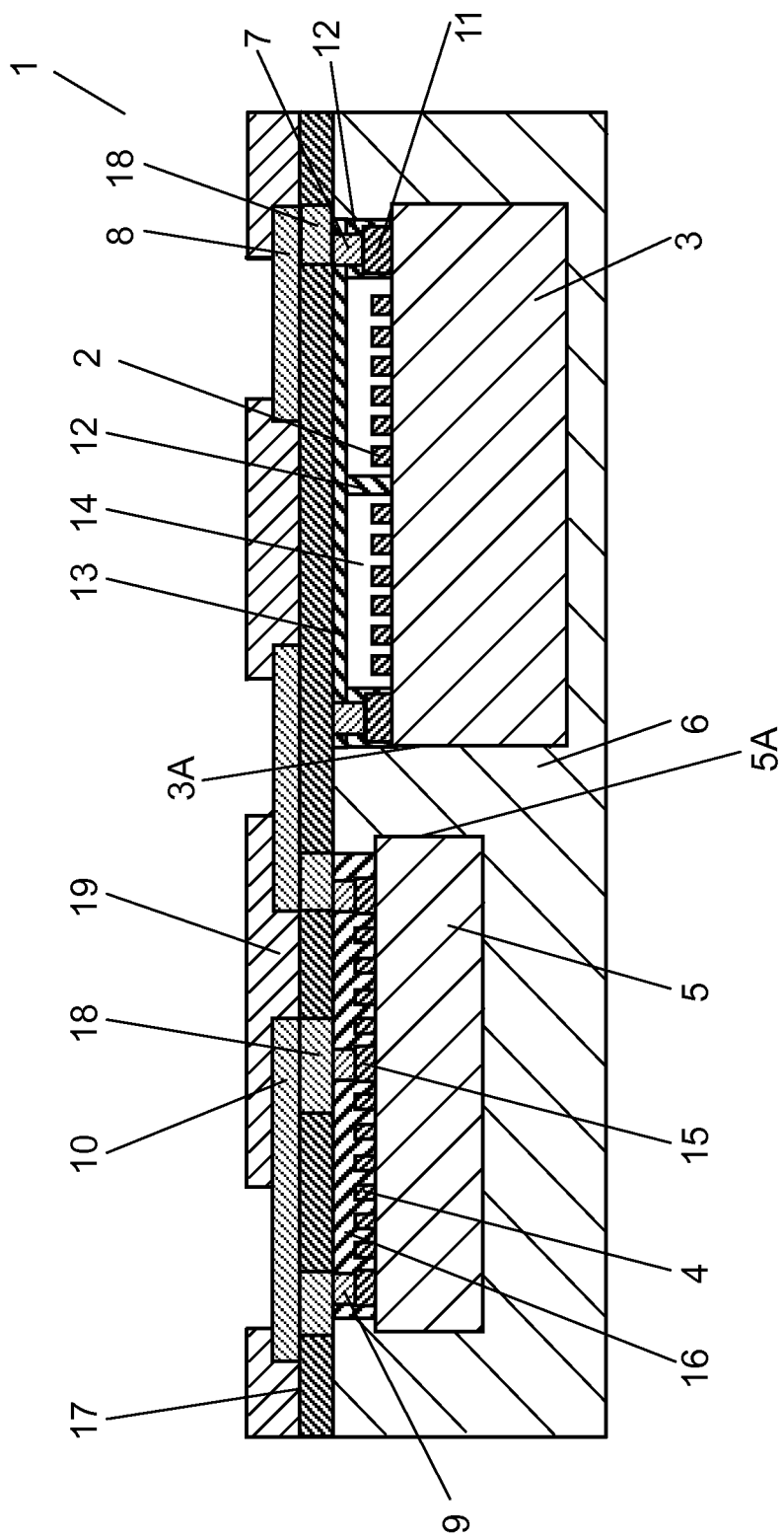

Next as shown in FIG. 12, form first externally connecting terminal 8, which is to be connected electrically to first pillar-like wiring electrode 7, on dielectric layer 17. Also form second externally connecting terminal 10, which is to be connected electrically to second pillar-like wiring electrode 9, on dielectric layer 17. During the same process of forming terminals 8 and 10, a wiring layer (not shown) is formed on dielectric layer 17. Terminals 8, 10 and the wiring layer can be formed by depositing films of appropriate metal material on dielectric layer 17, and then the films undergo a patterning process, or they can be formed by printing the appropriate metal material with the aid of a mask. In the embodiment, first and second externally connecting terminals 8 and 10 are formed this way: First, form a resist pattern on dielectric layer 17 as well as on connecting electrode 18 where openings have been prepared for terminals 8, 10 and the wiring layer to be formed therein. Next, a metal film is formed on the resist pattern by deposition, and the electrolytic plating process is provided thereto. As a result, copper film, nickel film, and gold film are formed, or a laminated film layered with these metal films is formed, on the deposited film. Then peel off the resist pattern, thereby forming first and second externally connecting terminals 8, 10 and the wiring layer as shown in FIG. 13. An inductor conductor, working as the wiring layer, to be connected electrically to first IDT electrode 2 can be formed during the foregoing process. Another inductor conductor, working as the wiring layer, to be connected electrically to second IDT electrode 4 can be also formed during this process. In this case, elastic-wave filter device 1 can use the inductor component of the inductor conductors built therein, so that a smaller dispersion in the characteristics can be expected comparing with a case where inductor components are externally mounted.

Next, as shown in FIG. 13, form upper-layer protective film 19 such that film 19 covers at least parts of the top face of dielectric layer 17 and the top faces of externally connecting terminals 8, 10. Film 19 is formed such that sections where terminals 8 and 10 are mounted to the substrate can be exposed. In this embodiment, upper-layer protective film 19 is formed by applying the composition of photosensitive epoxy resin onto dielectric layer 17, and terminals 8, 10 respectively by the spin-coating method, and then expose the photosensitive resin to light before it undergoes development and curing.

Figure 14:
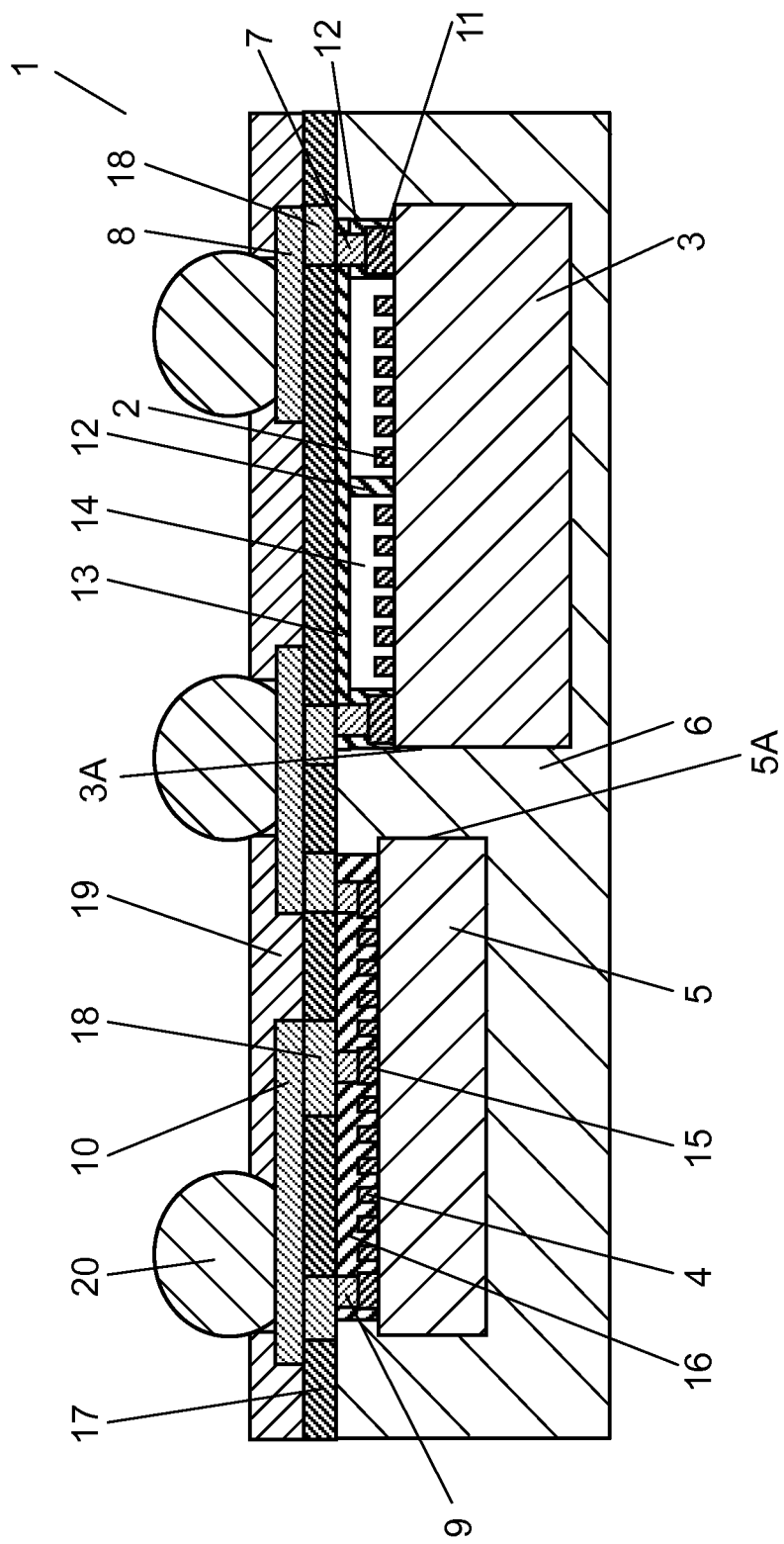

Then as shown in FIG. 14, print solder-paste by using a metal mask. Reflow-heating and flux-washing are then carried out for forming bump 20 to be connected to an external device.

Finally, dice the dielectric layer 17 into individual duplexers, thereby obtaining the elastic-wave filter device shown in FIG. 1.

The foregoing description refers to first piezoelectric substrate 3 as an elastic surface wave substrate, and second piezoelectric substrate 5 as an elastic boundary wave substrate; however, the structure is not limited to this one. For example, both of first and second piezoelectric substrates 3 and 5 can be the elastic surface wave substrates or both of them can be the elastic boundary wave substrates.

The foregoing description also refers to the first filter as transmission filter 23, and the second filter as reception filter 24; however, the structure is not limited to this one. For instance, the first filter can be the reception filter and the second filter can be the transmission filter, or both of the first and second filters can be the reception filters or both of them can be the transmission filters.

Figure 15:
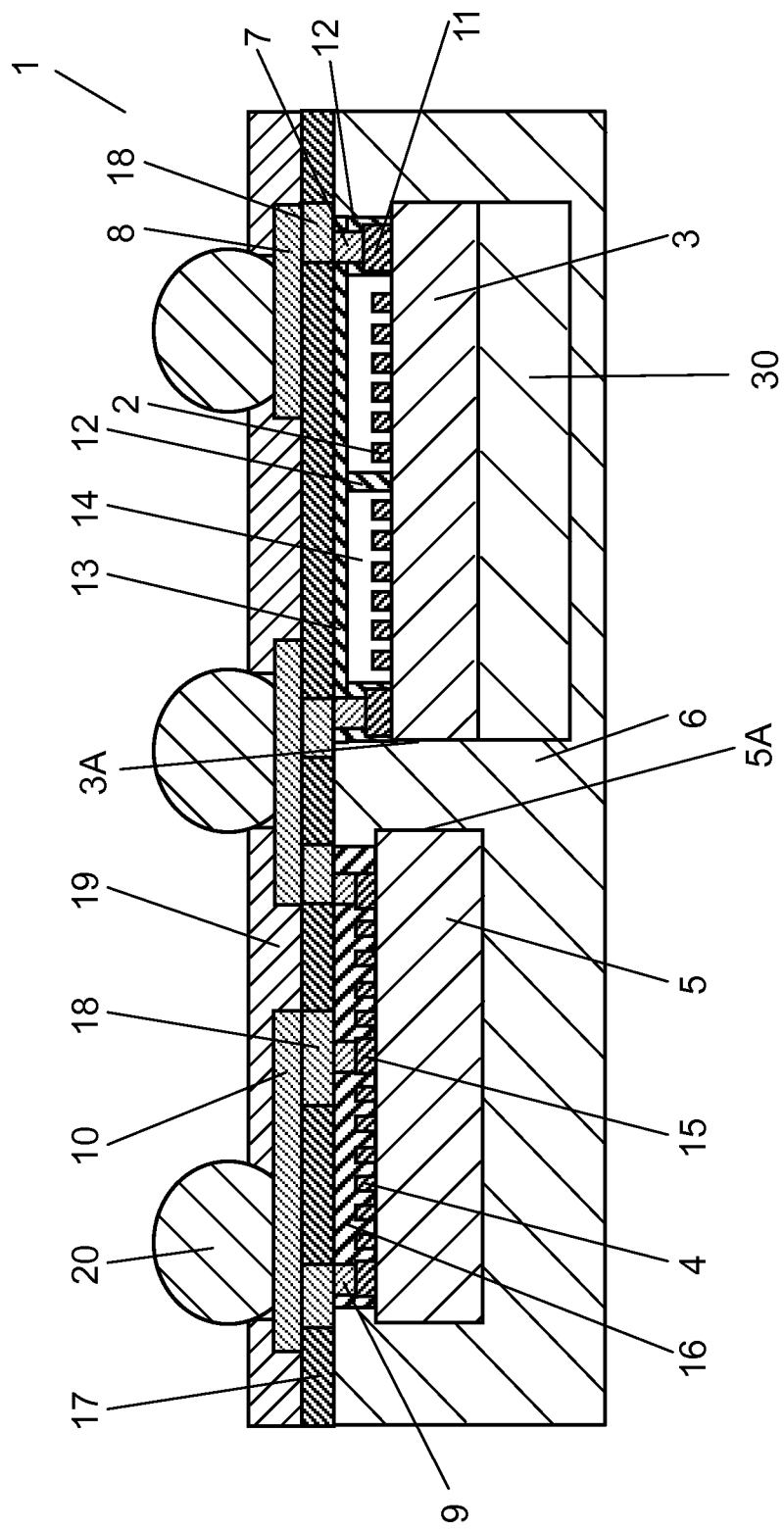
FIG. 15 is a sectional view schematically illustrating another elastic-wave filter device in accordance with an embodiment of the present invention.
Figure 16:
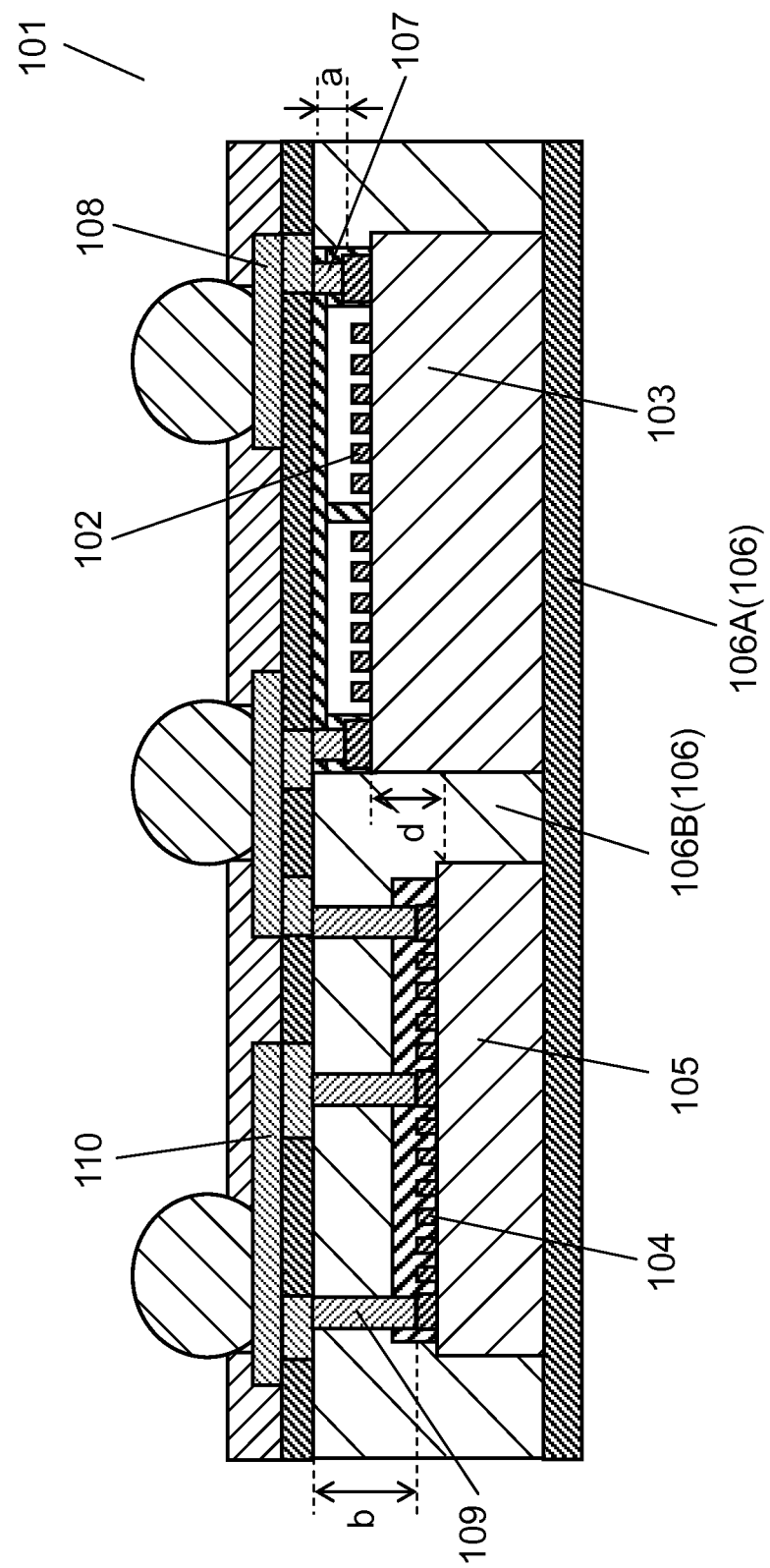
FIG. 16 is a sectional view schematically illustrating a conventional elastic-wave filter device.
Figure 17:
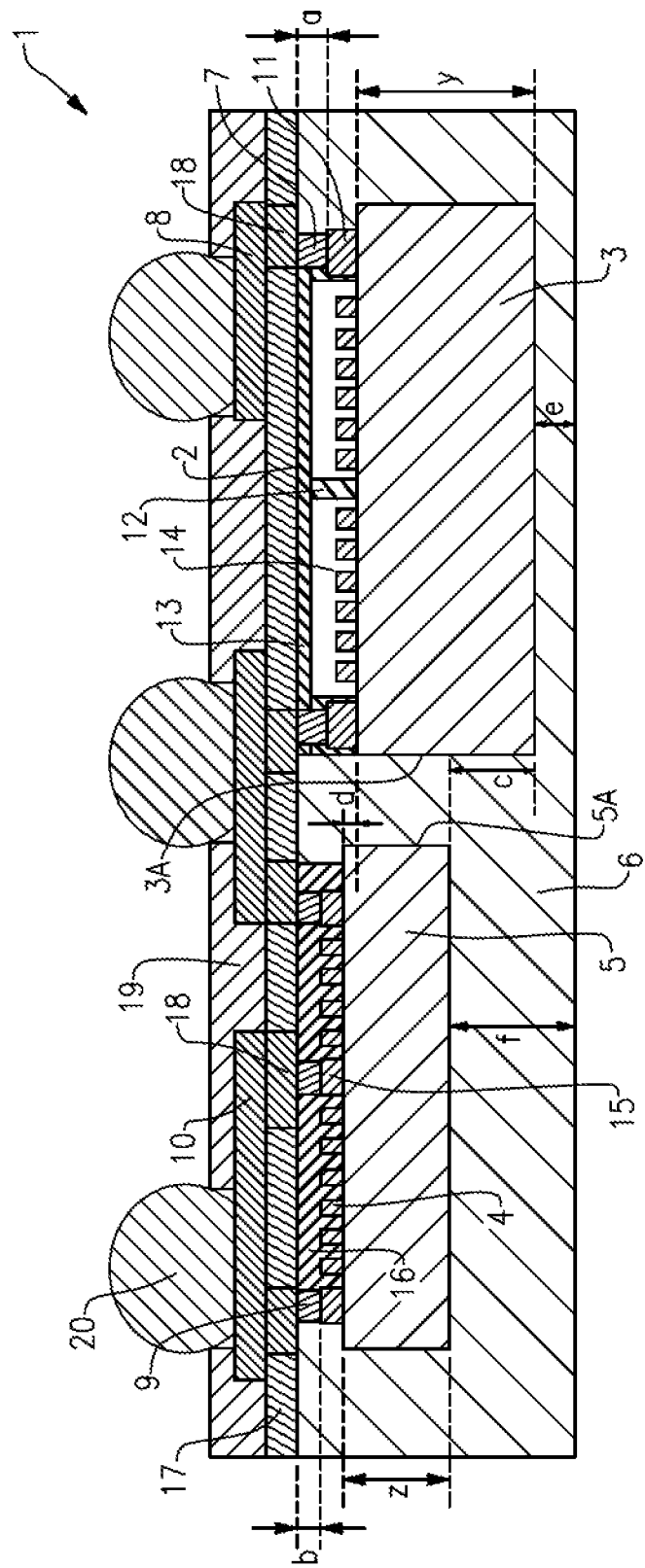
FIG. 17 is a sectional view schematically illustrating an elastic-wave filter device in accordance with another embodiment of the present invention.

The foregoing description also refers to the first functional substrate as first piezoelectric substrate 3, i.e. the elastic surface wave substrate, and the second functional substrate as second piezoelectric substrate 5, i.e. the elastic boundary wave substrate; however, the first and second functional substrates are not limited to this example. For instance, first or second functional substrate can be a semiconductor element. As shown in FIG. 15, the first functional substrate, which is relatively thicker, can be formed of a composite substrate including piezoelectric substrate 3 having IDT electrodes on the top face of substrate 3 and supporting substrate 30, e.g. a sapphire substrate, bonded to the underside of substrate 3.

Elastic-wave filter device 1 in accordance with this embodiment together with a semiconductor IC element (not shown) connected thereto can be employed in an electronic device that includes a reproducing device connecting to a semiconductor IC circuit element (not shown).

In the embodiment discussed above, the expressions indicating directions, e.g. top face, underside, refer to relative positional relations between the structural elements in the drawings, and they do not refer to absolute positional relations. For instance, an upside-down structure of the elastic-wave filter device shown in the drawings can produce an advantage similar to what is discussed previously as long as the relative positional relations between the structural elements remain unchanged from those of elastic-wave filter device 1 demonstrated in this embodiment.

The elastic-wave filter device of the present invention can be manufactured advantageously through a simpler process, and can be employed in electronic devices such as mobile communication devices.

What is claimed is:

1. An elastic-wave filter device comprising:
   a first piezoelectric substrate having a first interdigital transducer (IDT) electrode on a top face thereof;
   a second piezoelectric substrate having a second IDT electrode on a top face thereof and disposed such that a lateral face thereof confronts a lateral face of the first piezoelectric substrate, the first piezoelectric substrate being thicker than the second piezoelectric substrate, a distance between a plane including the top face of the first piezoelectric substrate and a plane including the top face of the second piezoelectric substrate being smaller than a distance between a plane including an underside of the first piezoelectric substrate and a plane including an underside of the second piezoelectric substrate;
   a first pillar-like wiring electrode formed above the first piezoelectric substrate and electrically connected to the first IDT electrode;
   a first externally connecting terminal electrically connected to the first pillar-like wiring electrode;
   a second pillar-like wiring electrode formed above the second piezoelectric substrate and electrically connected to the second IDT electrode;
   a second externally connecting terminal electrically connected to the second pillar-like wiring electrode;
   a dielectric sealing member covering the underside and the lateral face of the first piezoelectric substrate and the underside and the lateral face of the second piezoelectric substrate;
   a dielectric layer disposed between the dielectric sealing member and the first externally connecting terminal and between the dielectric sealing member and the second externally connecting terminal; and
   an upper-layer protective film disposed on a portion of the dielectric layer, a portion of the first externally connecting terminal, and a portion of the second externally connecting terminal.

2. The elastic-wave filter device of claim 1 wherein a difference between a height of the first pillar-like wiring electrode and a height of the second pillar-like wiring electrode is smaller than the distance between the plane including the underside of the first piezoelectric substrate and the plane including the underside of the second piezoelectric substrate.

3. The elastic-wave filter device of claim 1 wherein a distance between a plane including an underside of the sealing member under the first piezoelectric substrate and a plane including an underside of the sealing member under the second piezoelectric substrate is smaller than the distance between the plane including the underside of the first piezoelectric substrate and the plane including the underside of the second piezoelectric substrate.

4. The elastic-wave filter device of claim 1 wherein a distance between an underside of the sealing member below the first piezoelectric substrate and the underside of the first piezoelectric substrate is smaller than a distance between an underside of the sealing member below the second piezoelectric substrate and the underside of the second piezoelectric substrate.

5. The elastic-wave filter device of claim 1 wherein a pass band of a first filter formed of the first piezoelectric substrate is lower than a pass band of a second filter formed of the second piezoelectric substrate.

6. The elastic wave filter device of claim 1 further comprising a lateral wall formed of an insulating material surrounding at least a part of the first IDT electrode.

7. The elastic wave filter device of claim 6 further comprising a lid bonded to the lateral wall, the lateral wall, the lid, and the first piezoelectric substrate defining an air-tight space above the first IDT electrode.

8. The elastic wave filter device of claim 7 wherein the first pillar-like wiring electrode extends through the lateral wall and through the lid.

9. The elastic wave filter device of claim 7 wherein the first pillar-like wiring electrode is disposed outside of the lateral wall and the lid on an opposite side of the lateral wall as the air-tight space.

10. The elastic wave filter device of claim 9 wherein the first pillar-like wiring electrode is disposed on an outer surface of the lateral wall on the opposite side of the lateral wall as the air-tight space.

11. The elastic wave filter device of claim 7 further comprising an insulating film disposed on the second piezoelectric substrate and covering the second IDT electrode and a dielectric layer disposed between the lid and the first externally connecting terminal and between the insulating film and the second externally connecting terminal.

12. The elastic wave filter of claim 7 wherein the lid is a metal lid.

13. The elastic wave filter device of claim 1 further comprising an insulating film disposed on the second piezoelectric substrate and covering the second IDT electrode.

14. The elastic wave filter device of claim 13 wherein the second pillar-like wiring electrode extends through the insulating film.

15. The elastic wave filter device of claim 13 wherein the second pillar-like wiring electrode is disposed outside of the insulating film.

16. The elastic wave filter device of claim 1 further comprising a first electrically connecting bump disposed on the first externally connecting terminal and a second electrically connecting bump disposed on the second externally connecting terminal.

17. A composite device comprising:
   a first functional substrate having a first functional circuit on a top face thereof;
   a second functional substrate having a second functional circuit on a top face thereof and disposed such that a lateral face thereof confronts a lateral face of the first functional substrate, the first functional substrate being thicker than the second functional substrate, a distance between a plane including the top face of the first functional substrate and a plane including the top face of the second functional substrate being smaller than a distance between a plane including an underside of the first functional substrate and an underside of the second functional substrate;
   a first externally connecting terminal electrically connected to a first pillar-like wiring electrode electrically connected to the first functional circuit;
   a second externally connecting terminal electrically connected to a second pillar-like wiring electrode electrically connected to the second functional circuit;
   a dielectric sealing member covering the underside and the lateral face of the first functional substrate and the underside and the lateral face of the second functional substrate;
   a dielectric layer disposed between the dielectric sealing member and the first externally connecting terminal and between the dielectric sealing member and the second externally connecting terminal; and a protective film disposed on a portion of the dielectric layer, a portion of the first externally connecting terminal, and a portion of the second externally connecting terminal.

18. The composite device of claim 17 wherein the first functional substrate comprises a first piezoelectric substrate and a supporting substrate formed on the underside of the first piezoelectric substrate and the second functional substrate comprises a second piezoelectric substrate.

19. The elastic wave filter device of claim 17 wherein the distance between the plane including the top face of the first functional substrate and the plane including the top face of the second functional substrate is greater than zero.

20. A method of manufacturing an elastic-wave filter device comprising:

forming a first piezoelectric substrate having a first interdigital transducer (IDT) electrode on a top face thereof;

forming a second piezoelectric substrate having a second IDT electrode on a top face thereof, the first piezoelectric substrate being thicker than the second piezoelectric substrate;

mounting the first piezoelectric substrate in a same package as the second piezoelectric substrate so that a lateral face of the second piezoelectric substrate confronts a lateral face of the first piezoelectric substrate, a distance between a plane including the top face of the first piezoelectric substrate and a plane including the top face of the second piezoelectric substrate being smaller than a distance between a plane including an underside of the first piezoelectric substrate and a plane including an underside of the second piezoelectric substrate;

forming a first externally connecting terminal electrically connected to the first IDT electrode;

forming a second externally connecting terminal electrically connected to the second IDT electrode;

depositing a dielectric sealing member on the underside and the lateral face of the first piezoelectric substrate and on the underside and the lateral face of the second piezoelectric substrate;

forming a dielectric layer between the dielectric sealing member and the first externally connecting terminal and between the dielectric sealing member and the second externally connecting terminal; and forming an upper-layer protective film on a portion of the dielectric layer, a portion of the first externally connecting terminal, and a portion of the second externally connecting terminal.

* * * * *